United States Patent
Lee et al.

(10) Patent No.: US 10,242,956 B1
(45) Date of Patent: Mar. 26, 2019

(54) SEMICONDUCTOR DEVICE WITH METAL DAM AND FABRICATING METHOD

(71) Applicant: Amkor Technology, Inc., Tempe, AZ (US)

(72) Inventors: Dong Hee Lee, Incheon (KR); Min Yoo, Seoul (KR); Dae Byoung Kang, Seoul (KR); Bae Yong Kim, Jeollanam-do (KR)

(73) Assignee: AMKOR TECHNOLOGY, INC., Tempe, AZ (US)

( * ) Notice: Subject to any disclaimer, the term of this patent is extended or adjusted under 35 U.S.C. 154(b) by 40 days.

(21) Appl. No.: 13/894,403

(22) Filed: May 14, 2013

Related U.S. Application Data (63) Continuation of application No. 12/540,593, filed on Aug. 13, 2009, now Pat. No. 8,441,123.

(51) Int. Cl.
*H01L 23/40* (2006.01)
*H01L 23/52* (2006.01)
*H01L 29/40* (2006.01)
*H01L 23/58* (2006.01)
*H01L 23/498* (2006.01)

(52) U.S. Cl.
CPC ........ *H01L 23/58* (2013.01); *H01L 23/49811* (2013.01)

(58) Field of Classification Search
CPC . H01L 2224/73265; H01L 2224/48227; H01L 24/81; H01L 25/0657; H01L 21/563; H01L 23/58; H01L 23/49811
USPC ....................................................... 257/737
See application file for complete search history.

(56) References Cited

U.S. PATENT DOCUMENTS

| | | | |
|---|---|---|---|
| 5,719,440 A * | 2/1998 | Moden | 257/697 |
| 6,391,682 B1 | 5/2002 | Tsai et al. | |
| 6,400,036 B1 * | 6/2002 | Tang et al. | 257/780 |
| 6,404,059 B1 | 6/2002 | Iwasaki et al. | |
| 7,880,276 B2 * | 2/2011 | Nishimura et al. | 257/667 |
| 9,449,946 B2 * | 9/2016 | Sung | H01L 25/0657 |
| 2003/0052409 A1 * | 3/2003 | Matsuo | H01L 21/486 257/737 |
| 2004/0041279 A1 * | 3/2004 | Fuller | H01L 21/563 257/782 |
| 2006/0055062 A1 * | 3/2006 | Ohta | 257/784 |
| 2006/0108677 A1 * | 5/2006 | Ikeda | H01L 21/563 257/686 |

(Continued)

*Primary Examiner* — Moazzam Hossain
(74) *Attorney, Agent, or Firm* — McAndrews, Held & Malloy, Ltd.

(57) ABSTRACT

A semiconductor device is disclosed that may include a first semiconductor die comprising a copper pillar, a second semiconductor die comprising a copper pillar, and a conductive bump connecting the copper pillar of the first semiconductor die to the copper pillar of the second semiconductor die. The first semiconductor die may comprise a metal dam formed between the copper pillar and a bond pad on the first semiconductor die. The conductive bump may have a melting point lower than melting points of the copper pillar of the first semiconductor die and the copper pillar of the second semiconductor die. The first semiconductor die may be coupled to a substrate with a conductive wire coupled to the bond pad and to the substrate. The first semiconductor die may comprise a redistribution layer formed beneath the copper pillar on the first semiconductor die.

21 Claims, 5 Drawing Sheets

(56) References Cited

U.S. PATENT DOCUMENTS

| | | | |
|---|---|---|---|
| 2006/0220259 A1* | 10/2006 | Chen | H01L 21/563 257/778 |
| 2007/0045870 A1 | 3/2007 | Kuramochi | |
| 2007/0152025 A1* | 7/2007 | Fujimoto et al. | 228/180.22 |
| 2007/0287265 A1* | 12/2007 | Hatano | H01L 21/6835 438/458 |
| 2007/0290321 A1* | 12/2007 | Sundstrom | H01L 24/49 257/690 |
| 2008/0136023 A1* | 6/2008 | Komai | H01L 21/76898 257/737 |
| 2008/0150157 A1* | 6/2008 | Nishimura | H01L 21/563 257/777 |
| 2008/0157329 A1* | 7/2008 | Inoue | H01L 21/563 257/686 |
| 2009/0140407 A1* | 6/2009 | Chow | H01L 23/3128 257/686 |
| 2009/0166888 A1* | 7/2009 | Pozder et al. | 257/777 |
| 2009/0236738 A1* | 9/2009 | Shim | H01L 23/49894 257/737 |
| 2011/0012249 A1* | 1/2011 | Daubenspeck | H01L 21/563 257/686 |
| 2011/0024888 A1* | 2/2011 | Pagaila | H01L 23/13 257/686 |
| 2011/0074026 A1* | 3/2011 | Shim | H01L 21/4846 257/737 |

\* cited by examiner

SEMICONDUCTOR DEVICE WITH METAL DAM AND FABRICATING METHOD

CROSS-REFERENCE TO RELATED APPLICATION(S)

This application is a continuation of application Ser. No. 14/540,593 filed on Aug. 13, 2009, which is incorporated by reference in its entirety.

FIELD OF THE INVENTION

This invention relates to a semiconductor device and, more specifically, to a semiconductor device with metal dam and a fabricating method thereof.

BACKGROUND OF THE INVENTION

Multiple semiconductor dies may be mounted in a single package in one of two ways. Firstly, two or more semiconductor dies may be arranged next to one another in a horizontal direction along a substrate. Secondly, multiple semiconductor dies may be mounted on top of one another in a vertical direction, i.e. packaging the semiconductor dies into a chip-on-chip (COC) structure ('COC packaging method').

The COC packaging method includes preparing a bottom semiconductor die having a plurality of bond pads and a top semiconductor die having a plurality of bond pads. The bond pads of the bottom semiconductor die are interconnected to the bond pads of the top semiconductor die using conductive bumps. An underfill is injected into a gap between the bottom semiconductor die and the top semiconductor die. Bond pads formed around the circumference of the bottom semiconductor die are connected to a circuit board through conductive wires.

In the COC packaging method, a problem may occur in that an excessive flow of the underfill in the circumferential direction of the bottom semiconductor die may occur during injection. The underfill may cover the bond pads formed around the circumference of the bottom semiconductor die thus making it impossible for the wires to be bonded to the bond pads.

Therefore, a need existed to provide a system and method to overcome the above problem.

SUMMARY OF THE INVENTION

A semiconductor device has a first semiconductor die having at least one metal pillar formed along an inner perimeter and at least one bond pad formed along an outer perimeter. A second semiconductor die has at least one metal pillar. A conductive bump connects the at least one metal pillar of the first semiconductor die to the at least one metal pillar of the second semiconductor die. At least one metal dam is formed on the first semiconductor die between the at least one metal pillar of the first semiconductor die and the at least one bond pad.

The present invention is best understood by reference to the following detailed description when read in conjunction with the accompanying drawings.

BRIEF DESCRIPTION OF THE DRAWINGS

Common reference numerals are used throughout the drawings and detailed description to indicate like elements.

DETAILED DESCRIPTION

Figure 1:
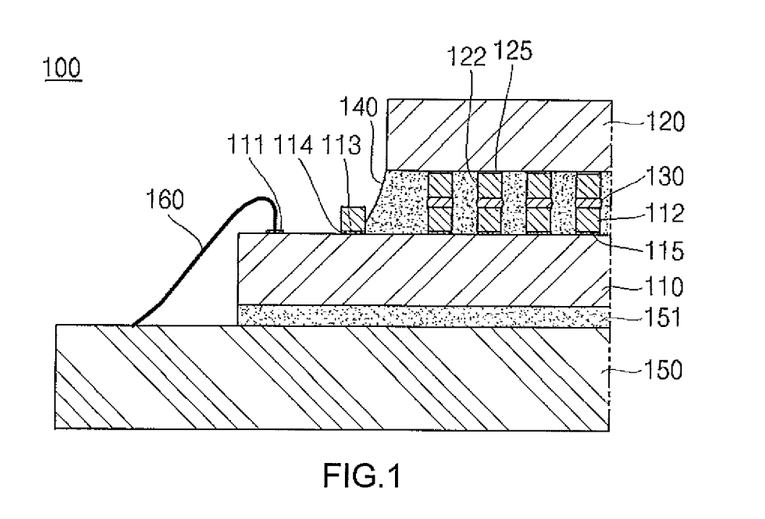
FIG. 1 is a partial cross-sectional view illustrating a semiconductor device having a metal dam according to an embodiment of the present invention.

Referring to FIG. 1, a partial cross-sectional view of a semiconductor device 100 having a metal dam according to one embodiment of the present invention is illustrated. The semiconductor device 100 may include a first semiconductor die 110, a second semiconductor die 120, conductive bumps 130, an underfill 140, substrate 150 and a conductive wire 160.

There is no restriction on the type of die for the first semiconductor die 110. For example, the first semiconductor die 110 may be selected from silicon semiconductors, GaAs semiconductors and equivalents thereof that are commonly known in the art. The first semiconductor die 110 may include at least one bond pad 111 formed substantially along a circumference thereof. Further, the first semiconductor die 110 may include first metal pillars 112 disposed substantially at a central area thereof.

The first semiconductor die 110 may include at least one metal dam 113 formed between the bond pad 111 and the first metal pillars 112. The metal dam 113 may be used to prevent an underfill 140 from bleeding out.

The first metal pillars 112 may be made of a material selected from gold (Au), nickel (Ni), copper (Cu), eutectic solders, lead-free solders, nickel-gold (Ni—Au) alloys, copper-nickel (Cu—Ni) alloys, copper (Cu) lead-free solders, and equivalents thereof. However, there is no restriction on the material of the first metal pillars 112. Bond pads or redistribution layers (RDLs) 115 may be positioned under the first metal pillars 112. The metal dam 113 may be made of a material selected from gold, nickel, copper, eutectic solders, lead-free solders, nickel-gold alloys, copper-nickel alloys, copper lead-free solders, and equivalents thereof. However, there is no restriction on the material of the metal dam 113.

A seed metal layer 114 may be formed under the metal dam 113. The seed metal layer 114 may be formed of a material selected from titanium (Ti), titanium tungsten (TiW) and equivalents thereof. However, there is no restriction on the material of the seed metal layer 114. The metal dam 113 may be greater in thickness than the first metal pillars 112. With these dimensions, the metal dam 113 can efficiently prevent the underfill 140 from bleeding out. The metal dam 113 may have a width of 1 to 100 μm, at which the form factor of the semiconductor device 100 can be improved.

There is no restriction on the kind of the second semiconductor die 120. For example, the second semiconductor die 120 may be selected from silicon semiconductors, GaAs semiconductors and equivalents thereof that are commonly known in the art. The second semiconductor die 120 includes a plurality of second metal pillars 122 disposed substantially at a central area center thereof. The second metal pillars 122 may be made of a material selected from gold (Au), nickel (Ni), copper (Cu), eutectic solders, lead-free solders, nickel-gold (Ni—Au) alloys, copper-nickel (Cu—Ni) alloys, copper (Cu) lead-free solders, and equivalents thereof. However, there is no restriction on the material of the second metal pillars. Bond pads or redistribution layers (RDLs) 125 may be positioned under the second metal pillars 122. The second semiconductor die 120 may have a width smaller than that of the first semiconductor die 110. Accordingly, the bond pad 111 of the first semiconductor die 110 is positioned outside the second semiconductor die 120. This configuration allows wire bonding of the bond pad 111.

The conductive bumps 130 may be used to electrically connect the first metal pillars 112 of the first semiconductor die 110 to the second metal pillars 122 of the second semiconductor die 120. The conductive bumps 130 may be made of a material selected form eutectic solders, lead-free solders, and equivalents thereof. However, there is no restriction on the material of the conductive bumps 130. The conductive bumps 130 may have a melting point lower than the melting points of the first metal pillars 112, the metal dam 113 and the second metal pillars 122. Accordingly, when the conductive bumps 130 are melted, the first metal pillars 112, the metal dam 113 and the second metal pillars 122 maintain their fine pitches without collapsing.

In accordance with one embodiment, the thicknesses of the first metal pillars 112, the metal dam 113 and the second metal pillars 122 may be in the range of approximately 5 to 50 μm. However, the thicknesses of the aforementioned are not limited to this range. The thickness of the conductive bumps 130 may be in the range of approximately 1 to 20 μm. However, the conductive bumps 130 are not limited to this range. The first metal pillars 112 and the second metal pillars 122 may be designed to be greater in thickness than the conductive bumps 130, so that stress can be sufficiently absorbed. Of course, the metal dam 113 may be designed to be greater in thickness than the conductive bumps 130, so that the underfill 140 can be sufficiently prevented from bleeding out.

The underfill 140 is filled between the first semiconductor die 110 and the second semiconductor die 120 to substantially surround the first metal pillars 112, the second metal pillars 122 and the conductive bumps 130. The underfill 140 serves to remove stress resulting from the difference in coefficient of thermal expansion between the first semiconductor die 110 and the second semiconductor die 120. The underfill 140 in a liquid state flows outwardly ('bleeding out') from the second semiconductor die 120 during injection. If bleeding out of the underfill 140 is excessive, the bond pad 111 of the first semiconductor die 110 is covered with the underfill 140, making it impossible for the wire to bonded thereto. In this embodiment, the metal dam 113 formed between the bond pad 111 and the first metal pillars 112 of the first semiconductor die 110 prevents excessive bleed-out of the underfill 140 to protect the bond pad 111 of the first semiconductor die 110 from being contaminated by the underfill 140.

The substrate 150 may be adhered to the semiconductor die 110 by means of an adhesive 151. The adhesive 151 may be an adhesive tape, a liquid adhesive, or the like. The listing of the above adhesive types should not be seen as to limit the scope of the present invention. The substrate 150 may be selected from laminated substrates, printed circuit boards, lead frames and equivalents thereof that are commonly known in the art, but is not limited thereto.

The conductive wire 160 serves to electrically interconnect the bond pad 111 of the first semiconductor die 110 to the circuit board 150.

In the semiconductor device 100, the metal dam 113 can be formed simultaneously with the first metal pillars 112, thereby eliminating the need for additional epoxy dam writing. This contributes to an improvement in the form factor of the semiconductor device 100 and enables the fabrication of the semiconductor device 100 in a stable manner. Further, since the metal dam 113 is made of a metal, not a solder, it is not melted during subsequent high-temperature processing. Accordingly, no short-circuiting occurs between the metal dam 113 and the bond pad 111.

Figure 2:
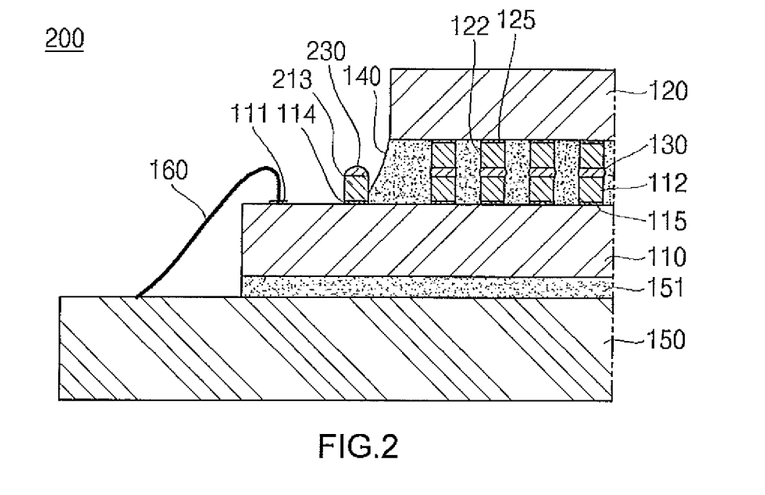
FIG. 2 is a partial cross-sectional view illustrating a semiconductor device having a metal dam according to a further embodiment of the present invention.

Referring to FIG. 2, a partial cross-sectional view of a semiconductor device 200 having a metal dam according to a further embodiment of the present invention is illustrated. The structure of the semiconductor device 200 is similar to that of the semiconductor device 100 illustrated in FIG. 1, and the structural differences between the semiconductor devices 100 and 200 will be explained below.

As illustrated in FIG. 2, the semiconductor device 200 may include a metal dam 213 and a conductive bump 230 formed on the metal dam 213. The conductive bump 230 may be made of a material selected form eutectic solders, lead-free solders, and equivalents thereof. However, there is no restriction on the material of the conductive bump 230.

The formation of the metal dam 213 and the conductive bump 230 leads to an increase in the thickness of the dam to more effectively prevent the underfill 140 from bleeding out. In addition, the need for an additional process is substantially eliminated due to the formation of the conductive bump 230. Metal plating is carried out on both the first metal pillars 112 and the metal dam 213 to simultaneously form the conductive bumps 130 and the conductive bump 230 thereon. That is, as a result of the metal plating, the conductive bump 230 is essentially formed on the metal dam 213. An additional process for removing the conductive bump 230 from the metal dam 213 is required in the fabrication of the semiconductor device 100, whereas the need for the removal of the conductive bump 230 is eliminated in the fabrication of the semiconductor device 200.

Figure 3:
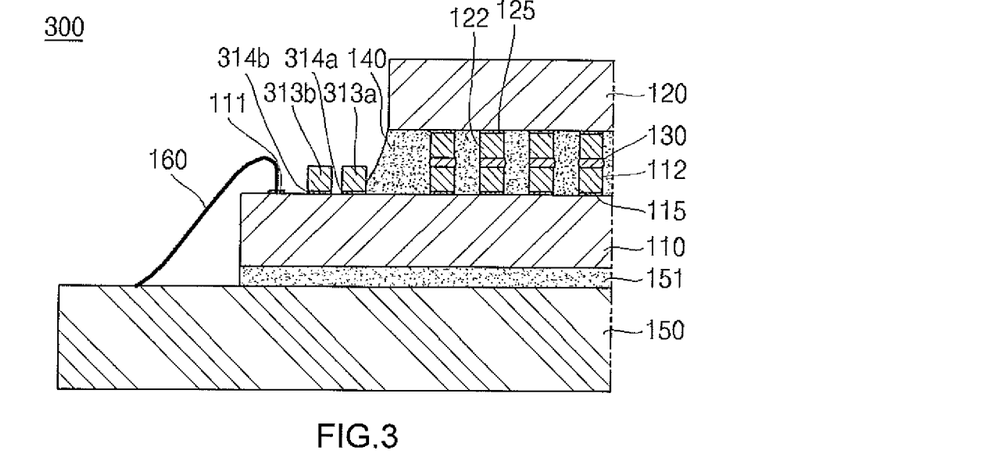
FIG. 3 is a partial cross-sectional view illustrating a semiconductor device having metal dams according to another embodiment of the present invention.

Referring to FIG. 3, a partial cross-sectional view of a semiconductor device 300 having metal dams according to another embodiment of the present invention is illustrated. The structure of the semiconductor device 300 is similar to that of the semiconductor device 100 illustrated in FIG. 1, and the structural differences between the semiconductor devices 100 and 300 will be explained below.

As illustrated in FIG. 3, two metal dams 313*a* and 313*b* may be spaced apart from each other in the horizontal direction. The two metal dams 313*a* and 313*b* may be made of a material selected from gold, nickel, copper, eutectic solders, lead-free solders, nickel-gold alloys, copper-nickel alloys, copper lead-free solders, and equivalents thereof. However, there is no restriction on the material of the metal dams 313*a* and 313*b*. Seed metal layers 314*a* and 314*b* may be formed under the metal dams 313*a* and 313*b*, respectively. The seed metal layers 314*a* and 314*b* may be formed of a material selected from titanium, titanium tungsten and equivalents thereof. However, there is no restriction on the material of the seed metal layers 314*a* and 314*b*.

In the semiconductor device 300, the two successive metal dams 313*a* and 313*b* more effectively prevent the underfill 140 from bleeding out to reduce the possibility that the underfill 140 overflowing the first metal dam 313a will overflow the second metal dam 313b.

Figure 4:
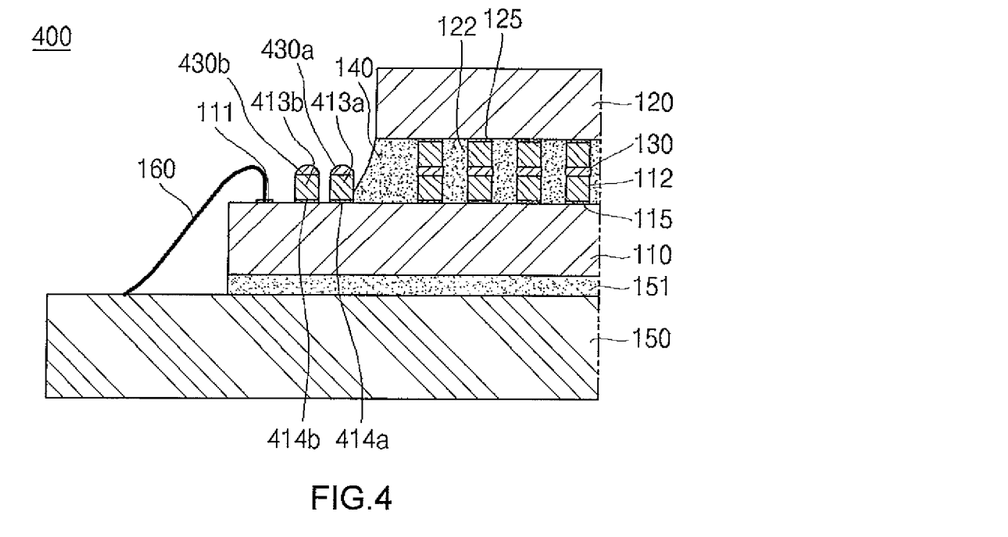
FIG. 4 is a partial cross-sectional view illustrating a semiconductor device having metal dams according to another embodiment of the present invention.

Referring to FIG. 4, a partial cross-sectional view of a semiconductor device 400 having metal dams according to another embodiment of the present invention is illustrated. The structure of the semiconductor device 400 is almost the same as that of the semiconductor device 300 illustrated in FIG. 3, and the structural differences between the semiconductor devices 300 and 400 will be explained below.

As illustrated in FIG. 4, the semiconductor device 400 may include two metal dams 413a and 413b and conductive bumps 430a and 430b formed on the metal dams 413a and 413b, respectively. The conductive bumps 430a and 430b may be made of a material selected form eutectic solders, lead-free solders, and equivalents thereof. However, there is no restriction on the material of the conductive bumps 430a and 430b.

The formation of the metal dams 413a and 413b and the conductive bumps 430a and 430b may lead to an increase in the thickness of the dam to more effectively prevent the underfill 140 from bleeding out. In addition, the need for an additional process is substantially eliminated due to the formation of the conductive bumps 430a and 430b. Metal plating is carried out on both the first metal pillars 112 and the two metal dams 413a and 413b to simultaneously form the conductive bumps 130 and the conductive bumps 430a and 430b thereon. That is, as a result of the metal plating, the conductive bumps 430a and 430b are essentially formed on the metal dams 413a and 413b, respectively. An additional process for removing the conductive bumps 430a and 430b from the metal dams 413a and 413b, respectively, is required in the fabrication of the semiconductor device 300, whereas the need for the removal of the conductive bumps 430a and 430b is eliminated in the fabrication of the semiconductor device 400.

Figure 5:
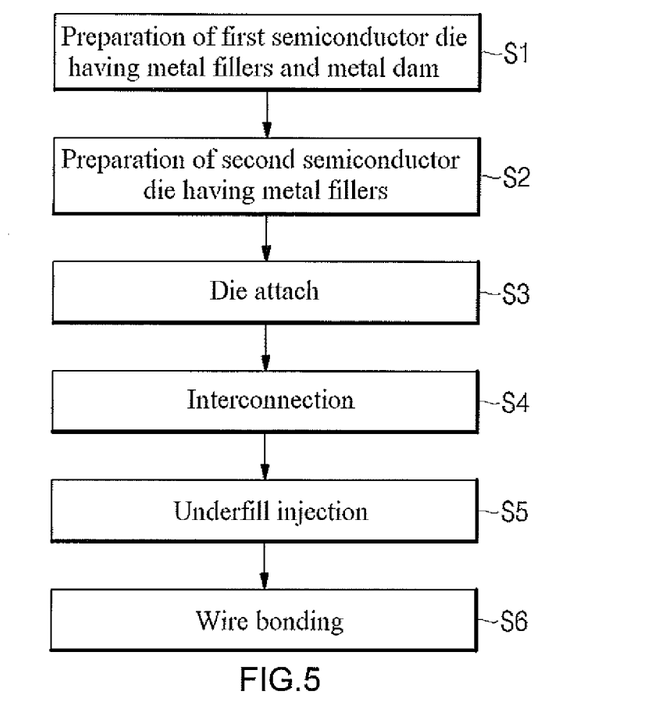
FIG. 5 is a flow chart illustrating a method for fabricating a semiconductor device having a metal dam according to an embodiment of the present invention.

Referring to FIG. 5, a flow chart of a method for fabricating a semiconductor device having a metal dam according to an embodiment of the present invention is illustrated. As illustrated in FIG. 5, the method includes the following steps: preparation of a first semiconductor die (S1), preparation of a second semiconductor die (S2), die attach (S3), interconnection (S4), underfill injection (S5), and wire bonding (S6).

Figure 6A:
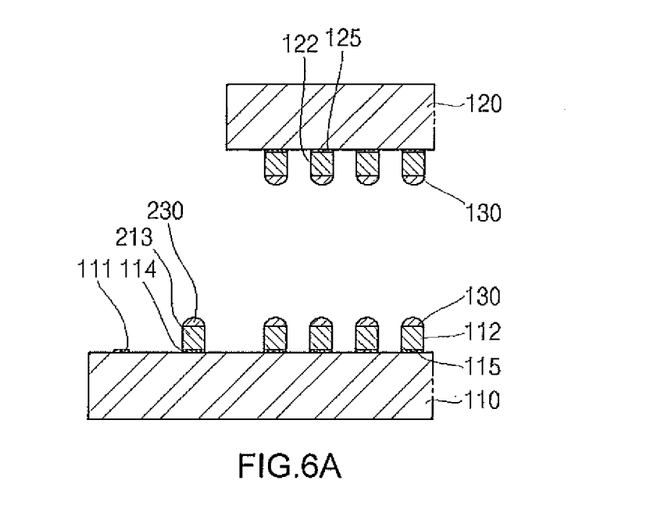
FIGS. 6A through 6E are cross-sectional views sequentially illustrating the method of FIG. 5.

Referring to FIGS. 6A through 6E, cross-sectional views sequentially illustrating the method of FIG. 5 are illustrated. As illustrated in FIG. 6A, a first semiconductor die 110 may have a plurality of first metal pillars 112 and at least one metal dam 213 may be prepared in step S1, and a second semiconductor die 120 having a plurality of second metal pillars 122 may be prepared in step S2.

Specifically, the first metal pillars 112 of the first semiconductor die 110 may be formed by metal plating, and the metal dam 213 may be formed between the bond pad 111 and the first metal pillars 112 by metal plating. The first metal pillars 112 may be simultaneously formed with the metal dam 213.

The first metal pillars 112 may be formed on bond pads and redistribution layers 115. The metal dam 213 may be formed on a seed metal layer 114. Conductive bumps 130 and a conductive bump 230 may be formed on the first metal pillars 112 and the metal dam 213, respectively. The conductive bumps 130 and 230 are formed at the same time.

The second metal pillars 122 of the second semiconductor die 120 may be formed by metal plating. The second metal pillars 122 may be formed on bond pads or redistribution layers 125. The first metal pillars 112 and the second metal pillars 122 may have the same pitches. The conductive bumps 130 may also be formed on the second metal pillars 122. That is, the conductive bumps 130 may be formed on the first metal pillars 112 and/or the second metal pillars 122.

Figure 6B:
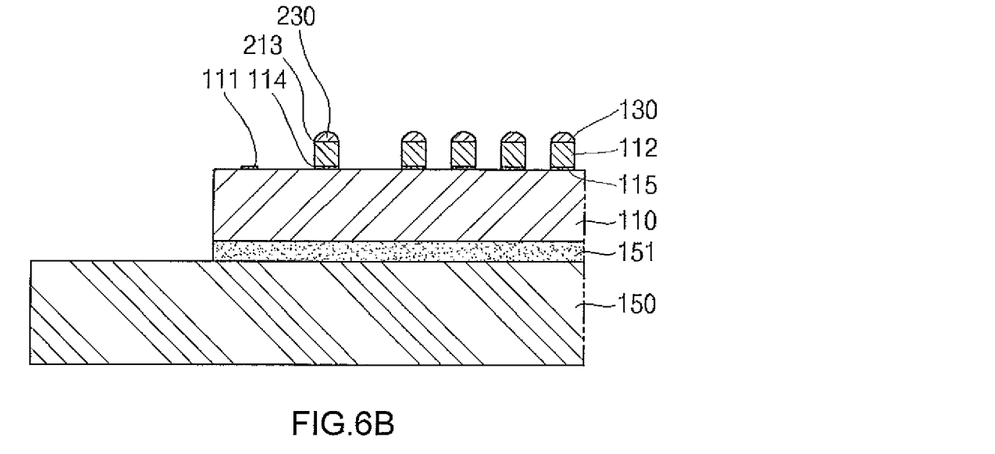

Although steps S1 and S2 are sequentially illustrated in FIGS. 6A and 6B, respectively, the present invention is not limited to this sequence. That is, the first semiconductor die 110 and the second semiconductor die 120 may be prepared simultaneously or in the reverse order.

As illustrated in FIG. 6B, in step S3, the first semiconductor die 110 may be adhered to a substrate 150 using an adhesive 151. The adhesive 151 may be an adhesive tape, a liquid adhesive, or the like. The substrate 150 may be selected from laminated substrates, printed circuit boards, lead frames and equivalents thereof.

Figure 6C:
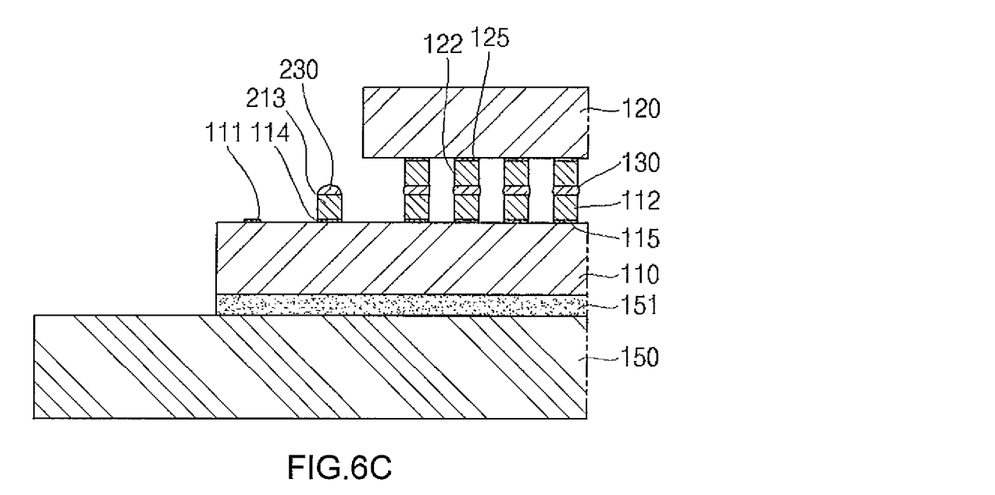

As illustrated in FIG. 6C, in step S4, the first semiconductor die 110 and the second semiconductor die 120 may be electrically interconnected to each other. First, the second metal pillars 122 of the second semiconductor die 120 are positioned on the first metal pillars 112 of the first semiconductor die 110. The first metal pillars 112 and or the second metal pillars 122 are formed with the conductive bumps 130 thereon. Subsequently, the conductive bumps 130 may be melted by increasing the temperature to approximately 150 to 250° C. Then, the temperature may be reduced to cool the conductive bumps 130 down to room temperature. This cooling allows the first metal pillars 112 to be electrically connected to the second metal pillars 122.

Figure 6D:
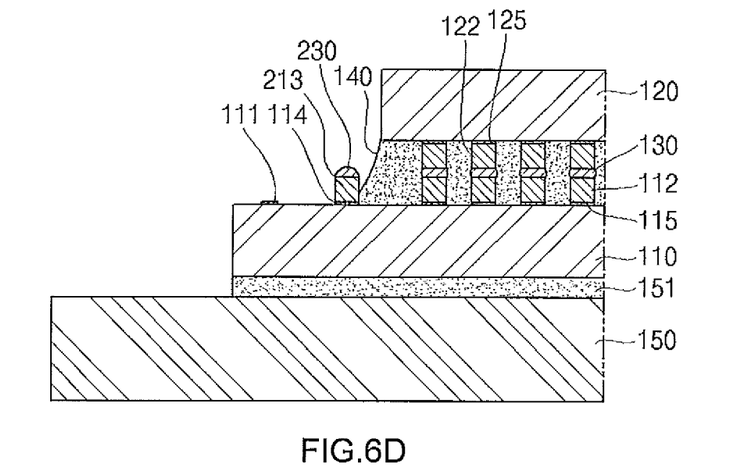

As illustrated in FIG. 6D, in step S5, an underfill 140 is filled in a gap between the first semiconductor die 110 and the second semiconductor die 120. The underfill 140 flows into the gap between the first semiconductor die 110 and the second semiconductor die 120 and surrounds the first metal pillars 112, the second metal pillars 122 and the conductive bumps 130.

The underfill 140 flowing in the circumferential direction of the first semiconductor die 110 is stopped by the metal dam 213 of the first semiconductor die 110. That is, excessive bleed-out of the underfill 140 is prevented by the metal dam 213, and therefore, the bond pad 111 of the first semiconductor die 110 is protected from contamination by the underfill 140.

Figure 6E:
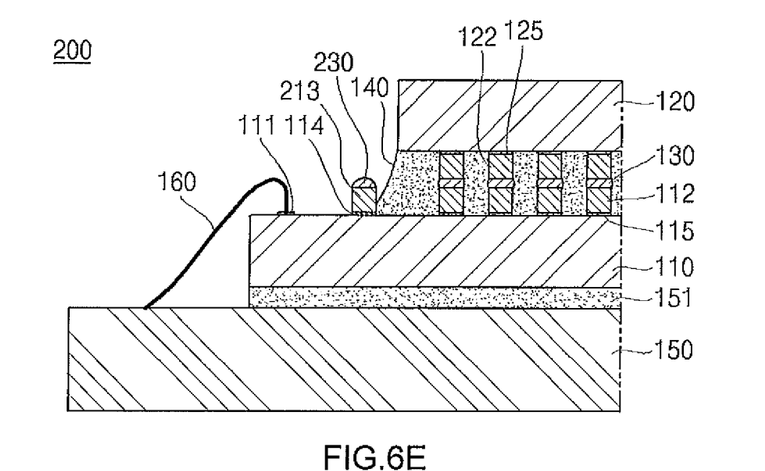

As illustrated in FIG. 6E, in step S6, the bond pad 111 of the first semiconductor die 110 and the substrate 150 may be bonded to each other through a conductive wire 160. The method may further include encapsulating the first semiconductor die 110, the second semiconductor die 120 and the conductive wire 160 by an encapsulant after step S6. Marking, sawing and solder ball attachment steps may be further carried out after the encapsulation.

In the fabrication of the semiconductor device 200, a metal dam 210 may be further formed between the bond pad 111 and the first metal pillars 112 in step S1. In step S5, bleeding-out of the underfill 140 is efficiently prevented by the metal dam 213. The metal dam 213 and the first metal pillars 112 may be formed at the same time, which eliminates the need for an additional process for forming a dam in subsequent processing steps. The metal dam 213 may be formed with a width and a thickness similar to those of the first metal pillars 112. These dimensions may improve the form factor of the semiconductor device 200.

In step S1, an electrode for metal plating is connected to sequentially form the outermost first semiconductor die 110 and the first metal pillars 112, which makes the metal dam 213 relatively thicker than the first metal pillars 112. As a result of the metal plating, the thicknesses of the first metal pillars 112 become relatively uniform.

The method may further include removing the conductive bump 230 formed on the metal dam 213 after step S4. The removal of the conductive bump 230 completes the fabrication of the semiconductor device 100 illustrated in FIG. 1. That is, the semiconductor device 100 has the same structure as the semiconductor device 200 of FIG. 2, except that the conductive bump 230 is removed.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. An electronic device comprising:
   a first structure comprising an inner perimeter and an outer perimeter;
   first metal pillars on the first structure, the first metal pillars located at the inner perimeter;
   a first metal dam on the first structure, the first metal dam delimiting the inner perimeter from the outer perimeter;
   a dam seed between the first metal dam and the first structure; and
   a pillar seed between the first metal pillars and the first structure,
   wherein:
      the dam seed and the pillar seed are portions of a same seed metal layer; and
      the first metal dam and the first metal pillars comprise respective portions of a same plating pattern on the first structure.

2. The electronic device of claim 1, further comprising:
   a bond pad on the first structure,
   wherein:
      the bond pad is located at the outer perimeter; and
      the first metal dam is located between the first metal pillars and the bond pad.

3. The electronic device of claim 1, wherein the first structure comprises a redistribution layer on a semiconductor die.

4. The electronic device of claim 1, further comprising:
   conductive bumps coupled to the first metal pillars of the first structure; and
   a second structure coupled over the first structure by the conductive bumps.

5. The electronic device of claim 1, further comprising:
   a second structure over the first structure and comprising second metal pillars,
   wherein the second metal pillars are coupled to the first metal pillars of the first structure.

6. The electronic device of claim 1, further comprising:
   an underfill over the first structure and extended from the first metal pillars to the first metal dam,
   wherein the underfill is restricted from the outer perimeter of the first structure by the first metal dam.

7. The electronic device of claim 1, wherein from a cross-section view, the first metal dam is at least one of thicker or wider than the first metal pillars.

8. The electronic device of claim 1, wherein the first metal pillars and the first metal dam have a first thickness.

9. The electronic device of claim 1, wherein the first metal pillars and the first metal dam have a first width.

10. The electronic device of claim 1, wherein the first metal dam comprises individual dam pillars with a pitch separation between the individual dam pillars.

11. The electronic device of claim 1, further comprising:
    a second metal dam,
    wherein:
       the first metal dam is located between the first metal pillars and the second metal dam, and
       the first metal dam and the second metal dam comprise respective portions of the same plating pattern on the first structure.

12. An electronic device comprising:
    a first structure comprising an inner perimeter and an outer perimeter;
    first metal pillars and a bond pad on the first structure, the first metal pillars located at the inner perimeter, the bond pad located at the outer perimeter; and
    a first metal dam on the first structure, the first metal dam delimiting the inner perimeter from the outer perimeter, and located between the first metal pillars and the bond pad;
    a dam seed between the first metal dam and the first structure; and
    a pillar seed between the first metal pillars and the first structure,
    wherein, from a cross-section view:
       the dam seed and the pillar seed are portions of a same seed metal layer;
       the first metal pillars have a first thickness and a first width; and
       the first metal dam has one or both of the first thickness and the first width.

13. The electronic device of claim 12, wherein the first metal dam has the first thickness.

14. The electronic device of claim 12, wherein the first metal dam has the first width.

15. The electronic device of claim 12, wherein the first metal dam has a width greater than the first width.

16. The electronic device of claim 12, wherein the first metal dam has a thickness greater than the first thickness.

17. The electronic device of claim 12, wherein the first metal dam and the first metal pillars comprise respective portions of a same plating pattern on the first structure.

18. The electronic device of claim 12, wherein the first metal dam comprises individual dam pillars with a pitch separation between the individual dam pillars.

19. A method comprising:
    providing first metal pillars and a first metal dam on a first structure, the first structure comprising an inner perimeter and an outer perimeter, the first metal dam delimiting the inner perimeter from the outer perimeter, the first metal pillars located at the inner perimeter; and
    forming a dam seed between the first metal dam and the first structure and a pillar seed between the first metal pillars and the first structure,
    wherein:
       the dam seed and the pillar seed are portions of a same seed metal layer; and
       the first metal dam and the first metal pillars comprise respective portions of a same plating pattern on the first structure.

20. The method of claim 19, further comprising:
    coupling a second structure to the first structure; and
    providing an underfill between the first and second structures, wherein the underfill extends from the first metal pillars to the first metal dam,
    wherein:
       the second structure comprises second metal pillars coupled to the first metal pillars;

the first structure comprises a bond pad at the outer perimeter;

portions of respective thicknesses of the first metal dam and of the first metal pillars are simultaneously formed;

providing the first metal dam comprises locating the first metal dam between the first metal pillars and the bond pad; and providing the underfill comprises restricting the underfill from the outer perimeter of the first structure via the first metal dam.

21. The method of claim 19, wherein the first metal dam comprises individual dam pillars with a pitch separation between the individual dam pillars.

\* \* \* \* \*